United States Patent
Takagi

(10) Patent No.: US 8,780,949 B2
(45) Date of Patent: Jul. 15, 2014

(54) OPTICAL SEMICONDUCTOR DEVICE

(71) Applicant: Kazuhisa Takagi, Tokyo (JP)

(72) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/780,651

(22) Filed: Feb. 28, 2013

(65) Prior Publication Data

US 2013/0343417 A1    Dec. 26, 2013

(30) Foreign Application Priority Data

Jun. 25, 2012  (JP) .................. 2012-142246

(51) Int. Cl.
| | | |
|---|---|---|
| *H01S 3/10* | (2006.01) | |
| *H01S 5/00* | (2006.01) | |
| *H01S 5/22* | (2006.01) | |
| *H01S 5/026* | (2006.01) | |
| *H01S 5/065* | (2006.01) | |
| *H01S 5/40* | (2006.01) | |
| *H01S 5/343* | (2006.01) | |
| *H01S 5/12* | (2006.01) | |

(52) U.S. Cl.
CPC . *H01S 5/22* (2013.01); *H01S 5/026* (2013.01); *H01S 5/0655* (2013.01); *H01S 5/4031* (2013.01); *H01S 5/34306* (2013.01); *H01S 5/12* (2013.01); *H01S 5/0265* (2013.01)
USPC .......................... 372/50.1; 372/26; 372/50.22

(58) Field of Classification Search
USPC ....................... 372/26, 32, 50.1, 50.12, 50.22
See application file for complete search history.

(56) References Cited

FOREIGN PATENT DOCUMENTS

| | | |
|---|---|---|
| JP | 2002-131713 A | 5/2002 |
| JP | 2002-204030 A | 7/2002 |
| JP | 2009-295879 A | 12/2009 |

*Primary Examiner* — Armando Rodriguez
(74) *Attorney, Agent, or Firm* — Leydig, Voit & Mayer, Ltd.

(57) ABSTRACT

An optical semiconductor device includes: a semiconductor substrate; a semiconductor laser part on the semiconductor substrate and having a vertical ridge; and an optical modulator part on the semiconductor substrate, having an inverted-mesa ridge, and modulating light emitted by the semiconductor laser part.

6 Claims, 2 Drawing Sheets

OPTICAL SEMICONDUCTOR DEVICE

BACKGROUND OF THE INVENTION

1. Field of the Invention

The present invention relates to an optical semiconductor device used in a transmitter for use in optical fiber communication and to a method of manufacturing the optical semiconductor device.

2. Background Art

Optical modulator integrated semiconductor laser devices having a semiconductor laser part and an optical modulator part integrated on a semiconductor substrate are used (see, for example, Japanese Patent Laid-Open No. 2009-295879). In ordinary cases, the optical modulator part and the semiconductor laser part are of a vertical ridge type (see, for example, Japanese Patent Laid-Open No. 2002-131713). In the vertical-ridge-type optical modulator part, however, the device resistance is increased in proportion to the area of the ridge top and the frequency characteristic deteriorates correspondingly. For this reason, the vertical-ridge-type optical modulator part is not suitable for high-speed modulation at 25 GHz or higher, for example. A construction having both the optical modulator part and the semiconductor laser part provided in inverted-mesa ridge form to reduce the device resistance of the optical modulator part has been proposed (see, for example, Japanese Patent Laid-Open No. 2002-204030).

SUMMARY OF THE INVENTION

In the case of the inverted-mesa ridge semiconductor laser part, selecting only the fundamental mode in transverse modes of laser light with an oscillation wavelength of 1.3 µm requires setting the ridge bottom width to 1.4 µm or less. This requires that the width be smaller by about 0.2 µm than that in the case of the vertical-ridge semiconductor laser part. When the same structure as the semiconductor laser part having only one transverse mode as fundamental mode is applied to the optical modulator part, there is a need to also reduce the ridge width of the optical modulator part. By doing so, the device resistance of the optical modulator part is increased in inverse proportion to the ridge width, resulting in a deterioration of the frequency characteristic.

In view of the above-described problems, an object of the present invention is to provide an optical semiconductor device and method for manufacturing the same which can stabilize the transverse mode of light oscillated in the semiconductor laser part and prevent deterioration of the frequency characteristic.

According to the present invention, an optical semiconductor device includes: a semiconductor substrate; a semiconductor laser part on the semiconductor substrate and having a vertical ridge; and an optical modulator part on the semiconductor substrate, having an inverted-mesa ridge, and modulating light emitted by the semiconductor laser part.

The present invention makes it possible to stabilize the transverse mode of light oscillated in the semiconductor laser part and prevent deterioration of the frequency characteristic.

Other and further objects, features and advantages of the invention will appear more fully from the following description.

DETAILED DESCRIPTION OF THE PREFERRED EMBODIMENTS

An optical semiconductor device and method for manufacturing the same according to the embodiments of the present invention will be described with reference to the drawings. The same components will be denoted by the same symbols, and the repeated description thereof may be omitted.

First Embodiment

Figure 1:
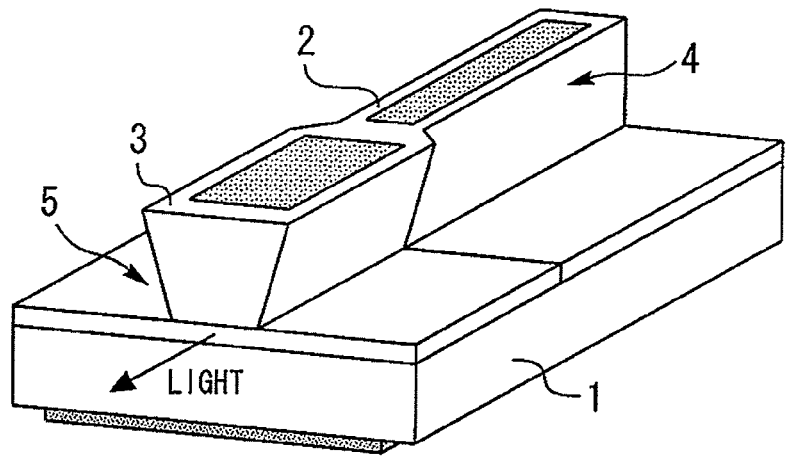
FIG. 1 is a perspective view showing an optical semiconductor device according to a first embodiment of the present invention.

FIG. 1 is a perspective view showing an optical semiconductor device according to a first embodiment of the present invention. This optical semiconductor device is an optical modulator integrated semiconductor laser device (electro-absorption modulated laser device) in which a distributed feed back type of semiconductor laser part 2 and an electro-absorption type of optical modulator part 3 are integrated on an n-InP substrate 1. An end surface on the semiconductor laser part 2 side is coated with a high-reflection (HR) coating, while an end surface of the optical modulator part 3 side is coated with an anti-reflection (AR) coating.

The semiconductor laser part 2 emits light of a predetermined wavelength. The optical modulator part 3 modulates light emitted by the semiconductor laser part 2. While the semiconductor laser part 2 has a vertical ridge 4, the optical modulator part 3 has an inverted-mesa ridge 5.

The vertical ridge 4 of the semiconductor laser part 2 can be formed, for example, by dry etching using $CH_4$, $H_2$ and $O_2$. The inverted-mesa ridge 5 of the optical modulator part 3 can be formed, for example, by wet etching using HCl and $H_2O$.

Figure 2:
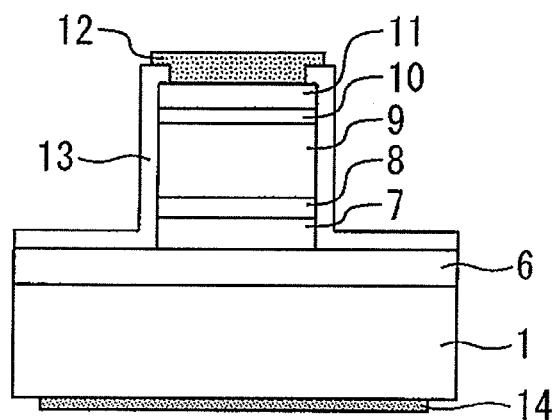
FIG. 2 is a sectional view showing the semiconductor laser part according to the first embodiment of the present invention.

FIG. 2 is a sectional view showing the semiconductor laser part according to the first embodiment of the present invention. An active layer 6, a p-InP clad layer 7, a p-InGaAsP diffraction grating layer 8, a p-InP clad layer 9, a p-InGaAsP-band discontinuity reduction (p-InGaAsP-BDR) layer 10 and a p-InGaAs contact layer 11 are successively stacked on the n-InP substrate 1. The active layer 6 has, for example, an InGaAsP multiple quantum well (InGaAsP-MQW) structure in which a plurality of compressive strained InGaAsP well layers and a plurality of tensile strained InGaAsP barrier layers exist alternately.

The vertical ridge 4 is formed for the p-InP clad layer 7, the p-InGaAsP diffraction grating layer 8, the p-InP clad layer 9, the p-InGaAsP-BDR layer 10 and the p-InGaAs contact layer 11. Side surfaces of the vertical ridge 4 are substantially perpendicular to a major surface of the n-InP substrate 1.

An anode electrode 12 is provided on the p-InGaAs contact layer 11. The side surfaces of the vertical ridge 4 and surfaces on opposite sides of the vertical ridge 4 are covered with $SiO_2$ insulating film 13, and a cathode electrode 14 is provided on a lower surface of the n-InP substrate 1.

By injection of a predetermined current between the anode electrode 12 and the cathode electrode 14, oscillation of laser is caused in the active layer 6, thereby radiating light of a predetermined single wavelength. At this time, only the resonance with the particular wavelength determined by the grating interval of the p-InGaAsP diffraction grating layer 8 occurs, so that the semiconductor laser part 2 can operate to perform single-wavelength oscillation with stability.

Figure 3:
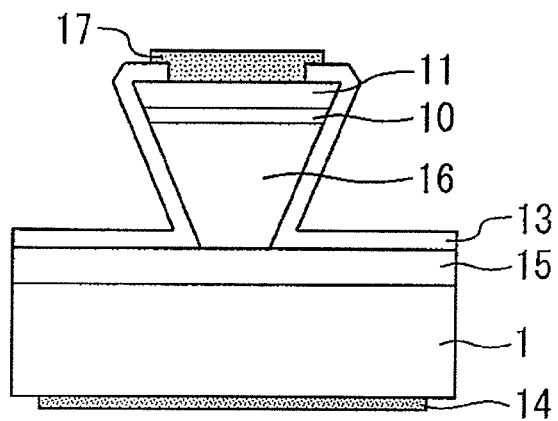
FIG. 3 is a sectional view showing the optical modulator part according to the first embodiment of the present invention.

FIG. 3 is a sectional view showing the optical modulator part according to the first embodiment of the present invention. A light absorbing layer 15, a p-InP clad layer 16, the p-InGaAsP-BDR layer 10 and the p-InGaAs contact layer 11 are successively stacked on the n-InP substrate 1. The active layer 6 has, for example, an InGaAsP-MQW structure in which a plurality of compressive strained InGaAsP well layers and a plurality of tensile strained InGaAsP barrier layers exist alternately. However, this construction is not exclusively used. An AlGaInAs-MQW structure may alternatively be used.

The inverted-mesa ridge 5 is formed for the p-InP clad layer 16, the p-InGaAsP-BDR layer 10 and the p-InGaAs contact layer 11. Side surfaces of the inverted-mesa ridge 5 are in inverted mesa form and formed of (111)A planes. The sectional shape of the inverted-mesa ridge 5 as seen in the direction of travel of light is a trapezoidal shape similar to an inverted triangle.

An anode electrode 17 is provided on the p-InGaAs contact layer 11, the side surfaces of the inverted-mesa ridge 5 and surfaces on opposite sides of the inverted-mesa ridge 5 are covered with $SiO_2$ insulating film 13, and the cathode electrode 14 is provided on the lower surface of the n-InP substrate 1. The anode electrode 12 on the semiconductor laser part 2 and the anode electrode 17 on the optical modulator part 3 are separated from each other.

The effects of the present embodiment will be described. Selecting only the fundamental mode in transverse modes of laser light with an oscillation wavelength of 1.3 μm in the semiconductor laser part 2 in the vertical ridge 4 requires setting the ridge bottom width to about 1.6 μm or less. The upper limit of the ridge bottom width is larger by about 0.2 μm than that in the case of the inverted-mesa type. Therefore the manufacturing margin at the time of stabilizing the transverse mode of light oscillated in the semiconductor laser part 2 can be increased.

Since the optical modulator part 3 is provided in inverted-mesa form, the device resistance of the optical modulator part 3 can be reduced and prevention of deterioration of the frequency characteristic is enabled. Thus, by changing the ridge-type structure between the optical modulator part 3 and the semiconductor laser part 2 in the way as in the present embodiment, the transverse mode of light oscillated in the semiconductor laser part 2 can be stabilized and prevention of deterioration of the frequency characteristic can be achieved.

Preferably, when the width of the bottom of the inverted-mesa ridge 5 of the optical modulator part 3 is d1 and a width of a bottom of the vertical ridge 4 of the semiconductor laser part 2 is d2, d1+0.2 μm>d2 is satisfied. By manufacturing in such a way as to satisfy this condition, the device resistance of the optical modulator part 3 can be reduced. An optical semiconductor device having a good frequency characteristic can be realized in this way. The width d1 can be increased because in the optical modulator part 3 the refractive index of the light absorbing layer 15 existing as a core layer in the optical waveguide is relatively smaller than that of the active layer 6 in the semiconductor laser part 2.

Second Embodiment

Figure 4:
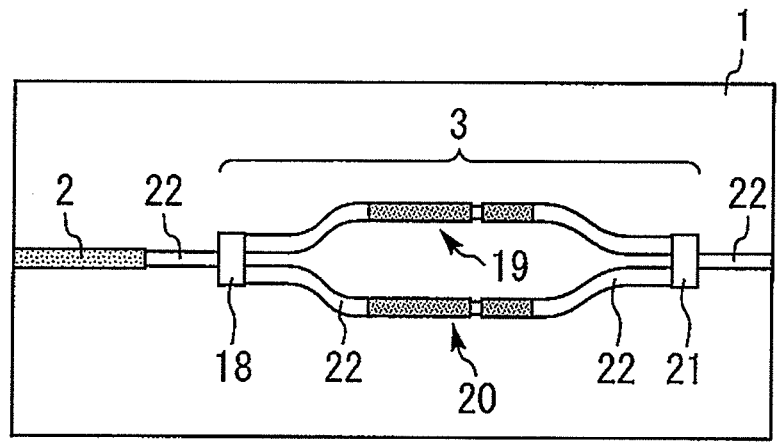
FIG. 4 is a plan view of an optical semiconductor device according to a second embodiment of the present invention.

FIG. 4 is a plan view of an optical semiconductor device according to a second embodiment of the present invention. In the present embodiment, an optical modulator part 3 is of a mach-Zehnder type. The optical modulator part 3 has a wave distributor 18, two optical modulators 19, 20 and an optical wave combiner 21. These components are connected by passive waveguide parts 22 provided on an n-InP substrate 1. A semiconductor laser part 2 and the passive waveguide parts 22 form a butt joint structure. The passive waveguide parts 22 guide light emitted by the semiconductor laser part 2 to the optical modulator part 3.

The semiconductor laser part 2 and the passive waveguide parts 22 have a vertical ridge 4, while the optical modulator part 3 has an inverted-mesa ridge 5, so that the transverse mode of light oscillated in the semiconductor laser part 2 can be stabilized and prevention of deterioration of the frequency characteristic can be achieved, as in the first embodiment.

Third Embodiment

Figure 5:
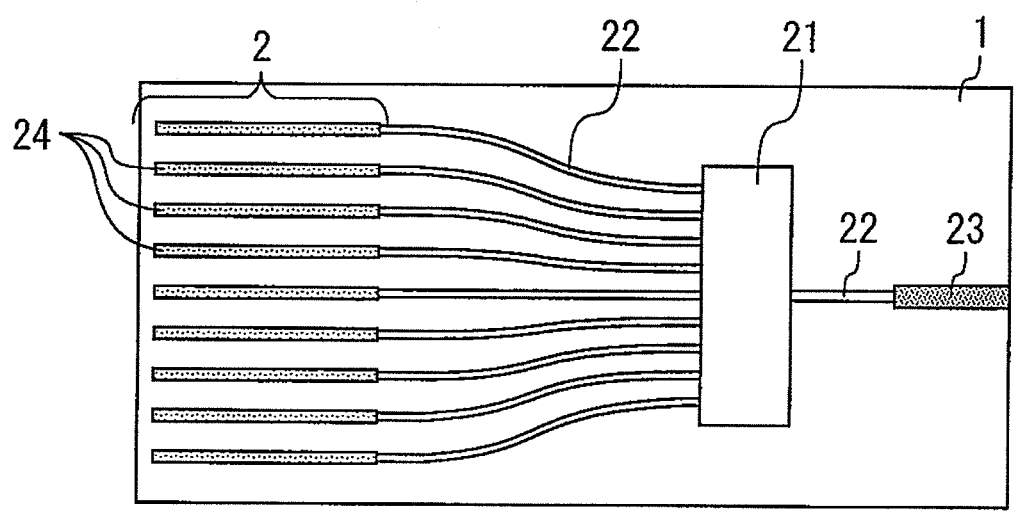
FIG. 5 is a plan view showing an optical semiconductor device according to a third embodiment of the present invention.

FIG. 5 is a plan view showing an optical semiconductor device according to a third embodiment of the present invention. A semiconductor laser part 2 and a semiconductor optical amplifier part 23 are integrated on an n-InP substrate 1. The semiconductor optical amplifier part 23 amplifies light emitted by the semiconductor laser part 2. The semiconductor laser part 2 is a laser array including a plurality of distributed feedback lasers 24 integrated on the n-InP substrate 1. An optical wave combiner 21 combines light emitted from the plurality of lasers 24 and inputs the combined light to the semiconductor optical amplifier part 23. The passive waveguide parts 22 connect between the plurality of lasers 24 and the optical wave combiner 21 and between the optical wave combiner 21 and the semiconductor optical amplifier part 23.

The semiconductor laser part 2 and the passive waveguide parts 22 have a vertical ridge 4, while the semiconductor optical amplifier part 23 has an inverted-mesa ridge 5, so that the transverse mode of light oscillated in the semiconductor laser part 2 can be stabilized and the device resistance of the semiconductor optical amplifier part 23 can be reduced to reduce the power consumption, as in the first embodiment.

The vertical ridge 4 in the semiconductor laser part 2 can be formed by dry etching. The inverted-mesa ridge 5 in the semiconductor optical amplifier part 23 can be formed by wet etching Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-142246, filed on Jun. 25, 2012, including specification, claims, drawings, and summary, on which the Convention priority of the present application is based, is incorporated herein by reference in its entirety.

What is claimed is:

1. An optical semiconductor device comprising:
  a semiconductor substrate;
  a semiconductor laser part on the semiconductor substrate and having a vertical ridge; and
  an optical modulator part on the semiconductor substrate, having an inverted-mesa ridge, and modulating light emitted by the semiconductor laser part.

2. The optical semiconductor device according to claim 1, wherein width of a bottom of the inverted-mesa ridge of the optical modulator part is d1, width of a bottom of the vertical ridge of the semiconductor laser part is d2, and d1+0.2 μm>d2 is satisfied.

3. The optical semiconductor device according to claim 1, further comprising a passive waveguide part on the semiconductor substrate, having a vertical ridge, and guiding light emitted by the semiconductor laser part to the optical modulator part.

4. The optical semiconductor device according to claim 1, wherein the optical modulator part is a Mach-Zehnder modulator.

5. An optical semiconductor device comprising:
 a semiconductor substrate;
 a semiconductor laser part on the semiconductor substrate and having a vertical ridge; and
 a semiconductor optical amplifier part on the semiconductor substrate, having an inverted-mesa ridge, and amplifying light emitted by the semiconductor laser part.

6. The optical semiconductor device according to claim 5, further comprising an optical wave combiner, wherein
 the semiconductor laser part includes a plurality of lasers integrated on the semiconductor substrate, and
 the optical wave combiner combines light emitted from the plurality of lasers and inputs the light combined to the semiconductor optical amplifier part.

\* \* \* \* \*